United States Patent
Lebby et al.

(10) Patent No.: US 7,605,531 B1
(45) Date of Patent: Oct. 20, 2009

(54) FULL COLOR DISPLAY INCLUDING LEDS WITH RARE EARTH ACTIVE AREAS AND DIFFERENT RADIATIVE TRANSISTIONS

(75) Inventors: Michael Lebby, Apache Junction, AZ (US); Vijit Sabnis, Los Altos, CA (US); Petar B. Atanackovic, Palo Alto, CA (US)

(73) Assignee: Translucent, Inc., Palo Alto, CA (US)

( * ) Notice: Subject to any disclaimer, the term of this patent is extended or adjusted under 35 U.S.C. 154(b) by 552 days.

(21) Appl. No.: 11/257,517

(22) Filed: Oct. 25, 2005

(51) Int. Cl.
*H01J 1/62* (2006.01)
*H01J 63/04* (2006.01)
*H01L 31/00* (2006.01)

(52) U.S. Cl. .................. 313/498; 313/483; 313/500; 313/501; 313/505; 313/506; 257/13; 257/22

(58) Field of Classification Search .............. None
See application file for complete search history.

(56) References Cited

U.S. PATENT DOCUMENTS

| | | | | |
|---|---|---|---|---|
| 6,831,304 B2 * | 12/2004 | Udagawa | ..................... | 257/94 |
| 6,872,471 B2 * | 3/2005 | Epstein et al. | .............. | 428/690 |
| 7,135,699 B1 * | 11/2006 | Atanackovic | ................ | 257/22 |
| 7,323,723 B2 * | 1/2008 | Ohtsuka et al. | ............... | 257/98 |
| 7,388,230 B1 * | 6/2008 | Lebby et al. | .................. | 257/89 |

* cited by examiner

*Primary Examiner*—Nimeshkumar D. Patel
*Assistant Examiner*—Natalie K Walford
(74) *Attorney, Agent, or Firm*—Parson & Goltry; Robert A. Parsons; Michael W. Goltry

(57) ABSTRACT

A full color display comprising a red, a green, and a blue light emitting diode, each light emitting diode including a light emitting region having at least one layer of single crystal rare earth material, the rare earth material in each of the light emitting diodes having at least one radiative transition, and the rare earth material producing a radiation wavelength of approximately 640 nm in the red light emitting diode, 540 nm in the green light emitting diode, and 460 nm in the blue light emitting diode. Generally, the color of each LED is determined by selecting a rare earth with a radiative transition producing a radiation wavelength at the selected color. In cases where the rare earth has more than one radiative transition, tuned mirrors can be used to select the desired color.

19 Claims, 5 Drawing Sheets

FULL COLOR DISPLAY INCLUDING LEDS WITH RARE EARTH ACTIVE AREAS AND DIFFERENT RADIATIVE TRANSISTIONS

FIELD OF THE INVENTION

This invention relates in general to displays, and more particularly to full color displays using colored light emitting diodes.

BACKGROUND OF THE INVENTION

Light emitting diodes (LEDs) are utilized in a great variety of devices to provide indicators, lighting devices, displays, etc. In this disclosure it should be understood that the term light emitting diode (LED) includes any of the well known light emitting devices, such as simple diodes, enhanced or super-emitting diodes, any of the various laser diodes including vertical cavity surfaces emitting lasers (VCSEL), etc. The major problem with LEDs is that they can be difficult to produce in any specific color. For example, in a full color display, a red, green, and blue or blue green diode must be included in each pixel to produce full color when the emitted colors are combined in the correct amounts. Producing LEDs that emit any desired or selected color can be difficult and in many instances expensive.

Displays are incorporated into a large number of today's technical devices, e.g. personal computers, telephones, cameras, etc. It has been found that these displays are much more desirable if provided in a full color arrangement. However, many electronic devices used to form the displays are difficult to form in a full color arrangement. In many instances at least one of the color emitting devices does not produce as much light as the other color emitting devices and the final color is unsatisfactory. In other instances filters and the like are used and the amount of light is substantially reduced so that the final display does not produce sufficient illumination.

It would be highly advantageous, therefore, to remedy the foregoing and other deficiencies inherent in the prior art.

Accordingly, it is an object of the present invention to provide a new and improved full color display.

Another object of the invention is to provide a new and improved full color display that produces accurate colors in accordance with well known color standards.

Another object of the invention is to provide a new and improved full color display in which different color emitting devices produce substantially equal illumination.

Another object of the invention is to provide a new and improved full color display that utilizes light emitting devices manufacturable using common well known semiconductor manufacturing techniques.

Another object of the invention is to provide a new and improved full color display formed in silicon using standard semiconductor manufacturing processes.

SUMMARY OF THE INVENTION

Briefly, to achieve the desired objects of the instant invention in accordance with a preferred embodiment thereof, provided is a full color display with a plurality of pixels, each pixel including a red, a green, and a blue light emitting diode (LED). Each LED includes a light emitting region having at least one layer of single crystal rare earth material having at least one radiative transition and producing a radiation wavelength of approximately 640 nm in the red LED, 540 nm in the green LED, and 460 nm in the blue LED. Generally, the color of each LED is determined by selecting a rare earth with a radiative transition producing a radiation wavelength at the selected color. In cases where the rare earth has more than one radiative transition, tuned mirrors can be used to select the desired color.

The desired objects and purposes of the present invention are further realized in a method of fabricating a full color display including the steps of providing a substrate and defining a plurality of regularly positioned pixels on the substrate, each pixel including a red, a green, and a blue light emitting diode. The method further includes selecting a rare earth material for each of the red, the green, and the blue light emitting diodes, the rare earth materials having at least one radiative transition producing a radiation wavelength of approximately 640 nm for the red light emitting diode, 540 nm for the green light emitting diode, and 460 nm for the blue light emitting diode, respectively. In one embodiment of the method the steps include positioning a first mirror on the substrate for each light emitting diode in each pixel, epitaxially growing a first cladding layer of intrinsic single crystal semiconductor material on each of the first mirrors, epitaxially growing a light emitting area including at least one thin single crystal layer of the selected rare earth material on the first cladding layer of each light emitting diode of each pixel, epitaxially growing a second cladding layer of intrinsic single crystal semiconductor material on the light emitting area of each light emitting diode of each pixel, and positioning a second mirror on the second cladding layer of each light emitting diode of each pixel. In applications where each rare earth material has a single radiative transition the upper and lower mirrors can be used simply to enhance light output or even eliminated. In cases where the rare earth has more than one radiative transition one or both of the upper and lower mirror stacks can be tuned to provide the single desired output.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
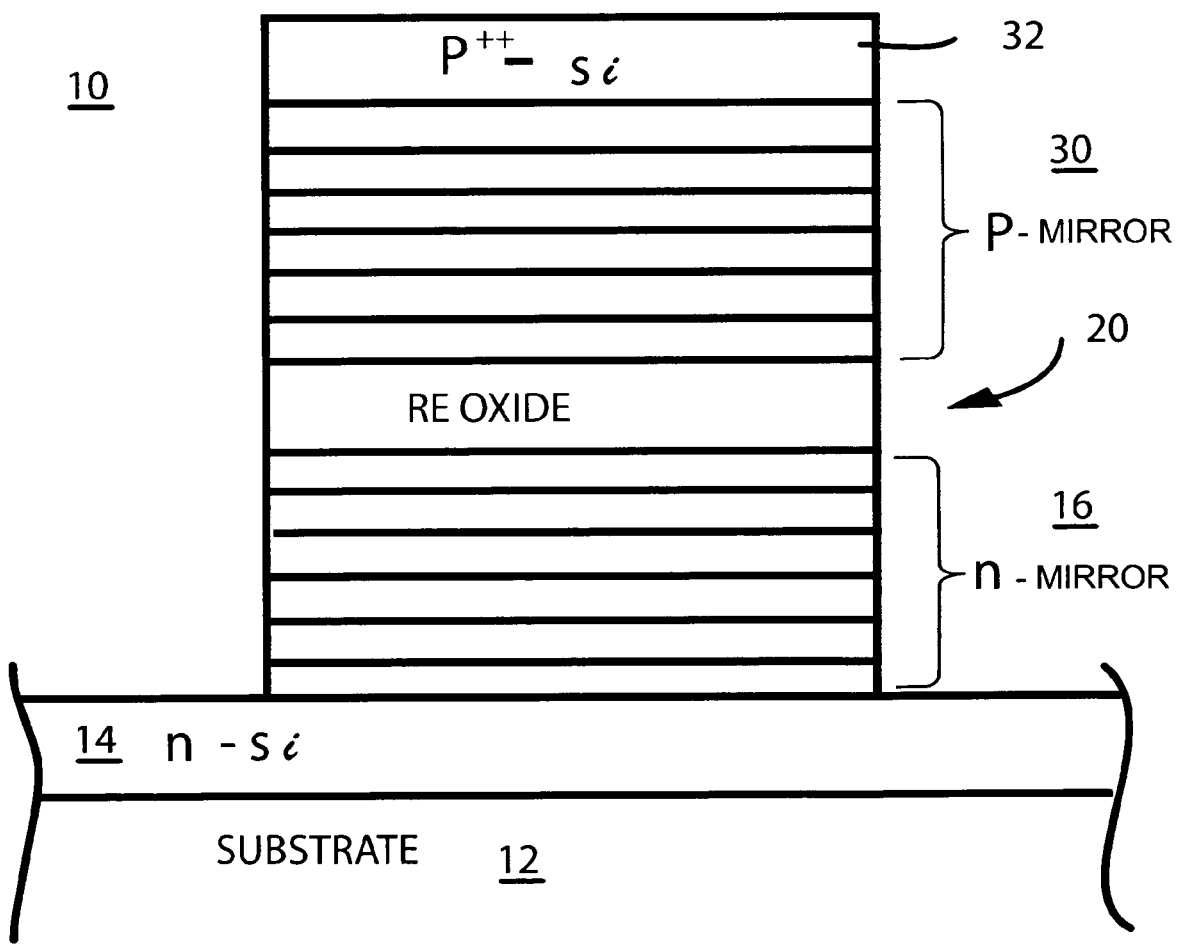
FIG. 1 is a simplified sectional view of an LED in accordance with the present invention.

Turning now to FIG. 1, a simplified sectional view of an LED 10, in accordance with the present invention, is illustrated. LED 10 is fabricated on a substrate 12, which in this embodiment includes single crystal silicon. However, substrate 12 is primarily a supporting structure and may be anything that provides the desired result. Throughout this example, silicon is used because most of the semiconductor industry is adapted to its use and working with silicon is well developed. It should, however, be understood that other materials might be used and silicon is only used in this description for exemplary purposes. Generally, the semiconductor material used is transparent to the emitted light.

In FIG. 1, a layer 14 of n-doped silicon is deposited on the surface of substrate 12 to provide the desired conductivity. In some embodiments layer 14 may be an enhanced or purer single crystal layer (i.e. grown on substrate 12 in a purer form) to enhance further single crystal growth. In some embodiments layer 14 can be heavily doped to provide a lower contact layer or substrate 12 can be doped with a contact on the rear surface thereof in a well known manner. In this disclosure, for purposes of simplicity of understanding, layer 14 and/or any additional or alternative layers are considered a part of the substrate structure. Also, in this embodiment layer 14 is an n-doped silicon layer for purposes of explanation but those skilled in the art will understand that the specific doping illustrated could be reversed or otherwise altered if desired.

A first mirror stack 16 of mirror pairs is formed on the surface of layer 14 using any of the well known deposition or epitaxial growth techniques. As is known in the art, each mirror pair includes layers of single crystal semiconductor material with different indices of refraction. Also, the thickness of a mirror pair is effectively a half wavelength, or multiple thereof, of the emitted light. Thus, each mirror pair reflects some of the emitted light back toward the emission center. Also, in this embodiment, each mirror pair in stack 16 includes materials that are relatively simple to deposit, such as silicon/silicon dioxide ($Si/SiO_2$) or silicon/RE Oxide but are transparent to the emitted light. Further, for purposes of this explanation, the layers of mirror stack 16 are n-doped to provide the required conductivity for a diode.

A light emitting region 20 is formed on the upper surface of mirror stack 16 and in this specific embodiment includes one or more (e.g. a super lattice) thin single crystal layers of rare earth (RE) material (rare earth oxide, nitride, oxynitride, etc.) As will be described in more detail below, the specific rare earth material used in the formation of light emitting region 20 can determine the emitted wavelength or emission color. In applications where a rare earth material with more than one radiative transition is used the mirror stack or stacks are tuned to the desired output wavelength.

A second mirror stack 30 of mirror pairs is formed on the upper surface of upper contact region 29 using any of the well known deposition or epitaxial growth techniques. As explained above, each mirror pair includes layers of single crystal semiconductor material with different indices of refraction and a thickness effectively a half wavelength, or multiple thereof, of the emitted light. Thus, each mirror pair reflects some of the emitted light back to the emission center. If LED 10 is intended to be only a simple LED, mirror stack 30 may reflect less light or, in some applications, may be completely eliminated. For purposes of differentiation, simple light emitting diodes include spontaneous emission while laser type diodes include stimulated emission. In the present embodiment the spontaneous emission is in the order of approximately 95% of the emitted light while approximately 5% or less is stimulated emission.

In this preferred, embodiment mirror stack 30 includes materials that are relatively simple to deposit, such as silicon/silicon dioxide ($Si/SiO_2$) or silicon/RE Oxide, p-doped to provide the required conductivity for a diode. It will of course be understood that, while mirror stack 30 is described as a semiconductor stack, it could be any of the distributed Bragg reflectors (DBRs) well known in the industry. Typically, DBRs or mirror stacks are formed of a material system generally consisting of two materials having different indices of refraction and being easily lattice matched to the other portions of the LED, however, other DBRs (dielectric stacks, etc.) can be provided using other techniques, e.g., wafer bonding or the like.

A heavily p-doped contact layer 32 is formed on the upper surface of upper mirror stack 30 to provide a second contact for LED 10. It will be understood that contact layer 32 may be omitted and a contact layer placed directly on light emitting region 20. This is especially true if upper mirror stack 30 is, for example, a dielectric (non-electrically conducting) DBR or if upper mirror stack 30 is not present.

Figure 2:
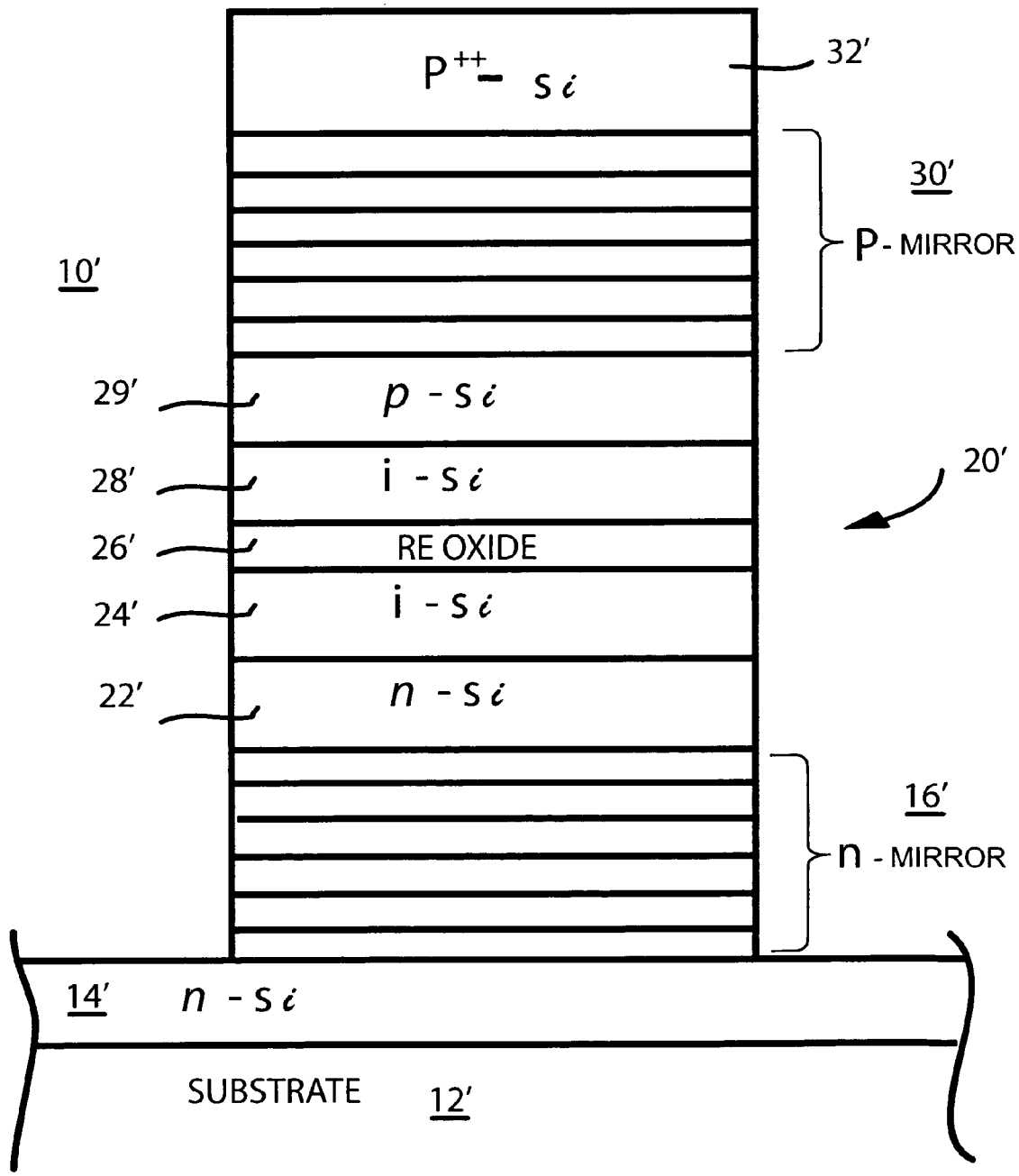
FIG. 2 is a simplified sectional view of another embodiment of an LED in accordance with the present invention.

Turning now to FIG. 2, a simplified sectional view of another embodiment of an LED, generally designated 10', in accordance with the present invention, is illustrated. In this embodiment components similar to components in FIG. 1 are designated with similar numbers and a prime (') is added to denote the different embodiment. LED 10' is fabricated on a substrate 12', which in this embodiment includes single crystal silicon. However, substrate 12' is primarily a supporting structure and may be anything that provides the desired result. Throughout this example, silicon is used because most of the semiconductor industry is adapted to its use and working with silicon is well developed. It should, however, be understood that other materials might be used and silicon is only used in this description for exemplary purposes.

In FIG. 2, a layer 14' of n-doped silicon is deposited on the surface of substrate 12' to provide the desired conductivity. In some embodiments layer 14' may be an enhanced or purer single crystal layer (i.e. grown on substrate 12' in a purer form) to enhance further single crystal growth. In some embodiments layer 14' can be heavily doped to provide a lower contact layer or substrate 12' can be doped with a contact on the rear surface thereof in a well known manner. In this disclosure, for purposes of simplicity of understanding, layer 14' and/or any additional or alternative layers are considered a part of the substrate structure. Also, in this embodiment layer 14' is an n-doped silicon layer for purposes of explanation but those skilled in the art will understand that the specific doping illustrated could be reversed or otherwise altered if desired.

A first mirror stack 16' of mirror pairs is formed on the surface of layer 14' using any of the well known deposition or epitaxial growth techniques. As is known in the art, each mirror pair includes layers of single crystal semiconductor material with different indices of refraction. Also, the thickness of a mirror pair is effectively a half wavelength, or multiple thereof, of the emitted light. Thus, each mirror pair reflects some of the emitted light back to the emission center. Generally, the total emission of a mirror stack should be in excess of 95% of the emitted light if lasing is desired (stimulated emission). If the device is intended to be only a simple LED, mirror stack 16' may reflect less light or, in some applications, may be completely eliminated. However, in this preferred embodiment mirror stack 16' is included to enhance the light output of LED 10'. Also, in this embodiment, each mirror pair in stack 16' includes materials that are relatively simple to deposit, such as silicon/silicon dioxide ($Si/SiO_2$) or silicon/RE Oxide. Throughout this disclosure it will be understood that all semiconductor materials do not conduct all visible light and the semiconductor materials used in the LEDs are generally transparent to the particular light being emitted. Further, for purposes of this explanation, the layers of mirror stack 16' are n-doped to provide the required conductivity for a diode.

A light emitting region 20' is formed on the upper surface of mirror stack 16' and in this specific embodiment includes a lower contact layer 22', one or more layers of cladding 24' (hereinafter "cladding layer 24"), a light emitting area 26', one or more layers of cladding 28' (hereinafter "cladding layer 28"), and an upper contact layer 29'. It will of course be understood that contact layers 22' and 29' are included in light emitting region 20' in this discussion only for purposes of simplicity of understanding and may be included or omitted in some embodiments. Also, it should be understood that light emitting area 26' and cladding layers 24' and 28' can be formed with an effective thickness of one or more wavelengths or fractions of wavelengths of the selected light to be emitted for purposes of lasing but may be any convenient thickness for simple light emitting diodes (spontaneous emission).

In this embodiment, lower contact region 22' is formed of single crystal n-doped silicon, and can be formed, for example, by epitaxially growing the crystalline silicon on the upper surface of mirror stack 16. Lower cladding layer 24' is formed of intrinsic, or un-doped, single crystal silicon. Light emitting area 26' is formed of one or more (e.g. super lattice) thin single crystal layers of rare earth (RE) material (rare earth oxide, nitride, oxynitride, etc.) defining one or more light emitting structures, preferably epitaxially grown on the surface of the single crystal un-doped silicon lower cladding layer 24'. Upper cladding layer 28' is formed of intrinsic, or un-doped, single crystal silicon, preferably epitaxially grown on the upper surface of light emitting area 26'. Upper contact region 29' is formed of single crystal p-doped silicon, and can be formed, for example, by epitaxially growing the crystalline silicon on the upper surface of upper cladding layer 28'.

A second mirror stack 30' of mirror pairs is formed on the upper surface of upper contact region 29' using any of the well known deposition or epitaxial growth techniques. As explained above, each mirror pair includes layers of single crystal semiconductor material with different indices of refraction and a thickness effectively a half wavelength, or multiple thereof, of the emitted light. Thus, each mirror pair reflects some of the emitted light back to the emission center. If LED 10' is intended to be only a simple LED, mirror stack 30' may reflect less light or, in some applications, may be completely eliminated.

In this preferred, embodiment mirror stack 30' includes materials that are relatively simple to deposit, such as silicon/silicon dioxide ($Si/SiO_2$) or silicon/RE Oxide, p-doped to provide the required conductivity for a diode. It will of course be understood that, while mirror stack 30' is described as a semiconductor stack, it could be any of the distributed Bragg reflectors (DBRs) well known in the industry. Typically, DBRs or mirror stacks are formed of a material system generally consisting of two materials having different indices of refraction and being easily lattice matched to the other portions of the LED, however, other DBRs (dielectric stacks, etc.) can be provided using other techniques, e.g., wafer bonding or the like.

A heavily p-doped contact layer 32' is formed on the upper surface of upper mirror stack 30' to provide a second contact for LED 10'. It will be understood that contact layer 32' may be omitted and contact layer 29' may serve as the upper contact in some embodiments. This is especially true if upper mirror stack 30' is, for example, a dielectric (non-electrically conducting) DBR or if upper mirror stack 30' is not present.

Figure 3:
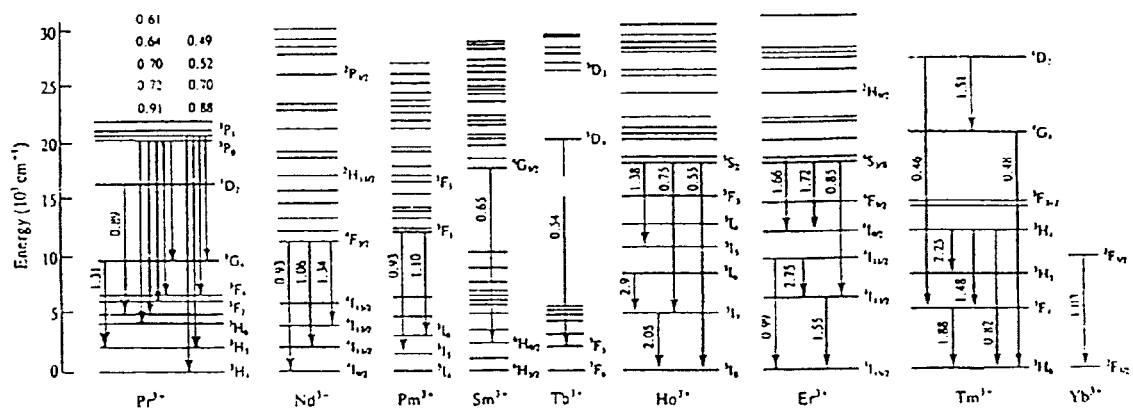
FIGS. 3 and 4 graphically illustrate some materials that can be used in the LEDs of FIG. 1 or 2 to provide red, green, and blue or blue-green colors.
Figure 4:
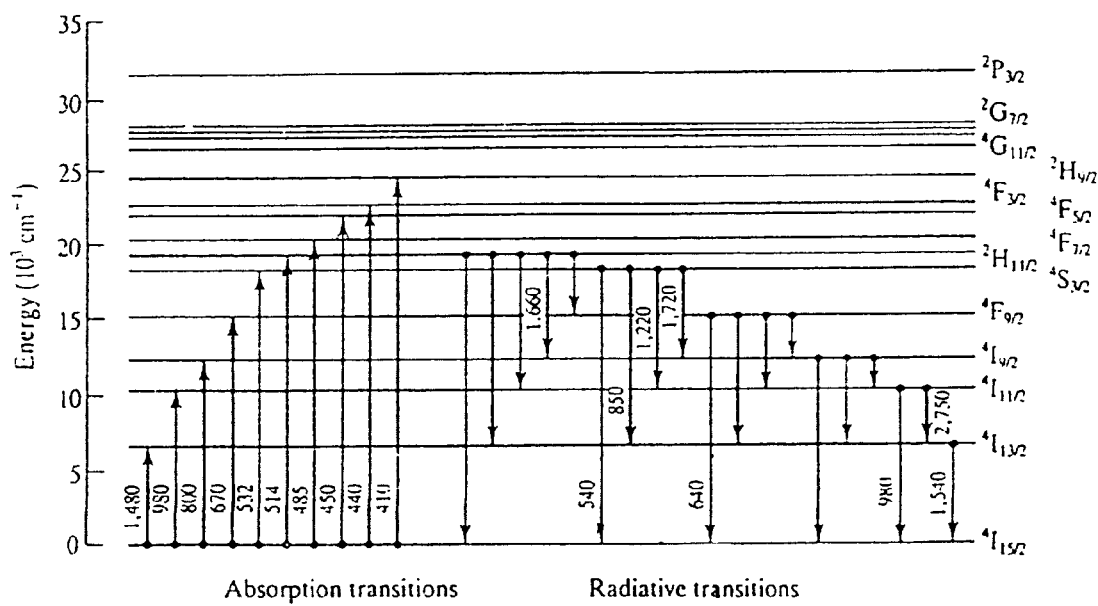

Referring additionally to FIG. 3, some typical rare earths that can be included in light emitting region 20 of FIG. 1 or light emitting region 20' of FIG. 2 are illustrated. The rare earths illustrated are, from left to right, Praseodymium (Pr), Neodymium (Nd), Promethium (Pm), Samarium (Sm), Terbium (Tb), Holmium (Ho), Erbium (Er), Thulium (Tm), and Ytterbium (Yb). Various radiative transitions for each of the rare earths are illustrated to show potential emission colors for each rare earth. As an example, Thulium (Tm) has a radiative transition of 0.46 (460 nm), which is a blue-green wavelength. Referring additionally to FIG. 4, some further radiative transitions that can be formed in Erbium (Er) are illustrated. Here, for example, it will be noted that radiative transitions at 540 nm, a green wavelength, and 640 nm, a red wavelength, are available.

Using the information provided above for rare earth materials and referring back to LED 10 of FIG. 1 or LED 10' of FIG. 2, LEDs that emit different colored light can be provided. The colored light selection is accomplished by choosing a rare earth with a radiative transition at the wavelength of desired light, for example, Thulium (Tm) with a radiative transition of 0.46 (460 nm). In this fashion, by choosing a rare earth with a radiative transition at the wavelength of desired light, LEDs can be manufactured that emit substantially any desired color.

To further enhance the light emission, mirror stack 16 of LED 10 is formed so that each mirror pair in stack 16 has an effective thickness of one half wavelength at the 460 nm radiation. Mirror stack 30 of LED 10 is formed so that each mirror pair in stack 30 has an effective thickness of one half wavelength at the 460 nm radiation. Thus, LED 10 is effectively tuned to emit light with a 460 nm wavelength.

In the case of a rare earth, such as Erbium (Er), with multiple radiative transitions in the visible light range, the mirror stacks can be tuned to a chosen one of the radiative transitions so that a selected light is emitted and the other radiative transitions have no effect. Also, in LED 10' light emitting region 20' can be tuned to the chosen radiative transition. For example, if Erbium (Er) material is used in light emitting area 26', the mirror stacks and the light emitting region 20' can be tuned to either 540 nm, to emit green light, or to 640 nm, to emit red light. Here it should be understood that tuning light emitting region 20' for a selected color may be sufficient in some simplified embodiments and mirror stacks may not be included. Further, in other embodiments, mirror stacks 16 or 16' and/or mirror stacks 30 or 30' may be greatly reduced (a lesser number of pairs) or omitted while still achieving sufficient selectivity for a specific application. It will be understood, however, that LED 10 with at least some mirror stack on the top and bottom is the preferred embodiment to achieve the purest light.

Figure 5:
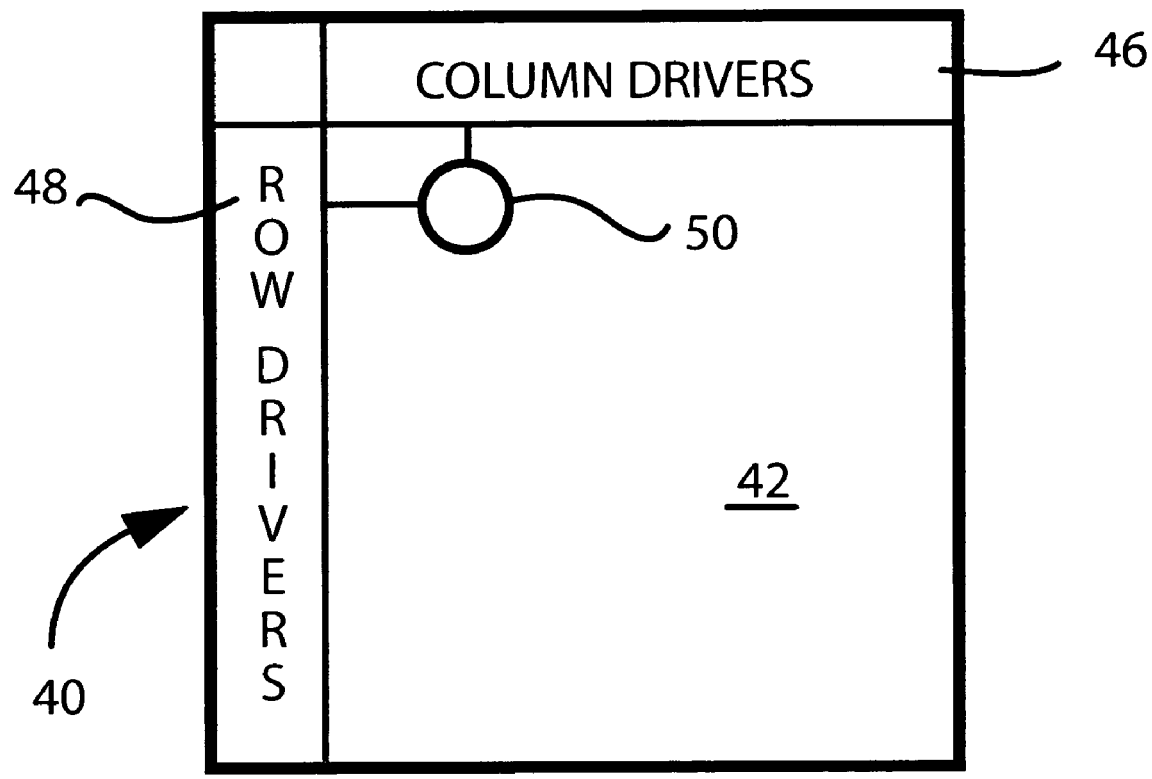
FIG. 5 is a plan view of a display in accordance with the present invention.
Figure 6:
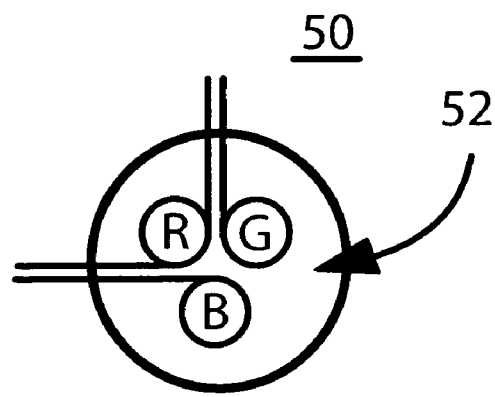
FIG. 6 is a portion of the display of FIG. 5 broken out and greatly enlarged.
Figure 7:
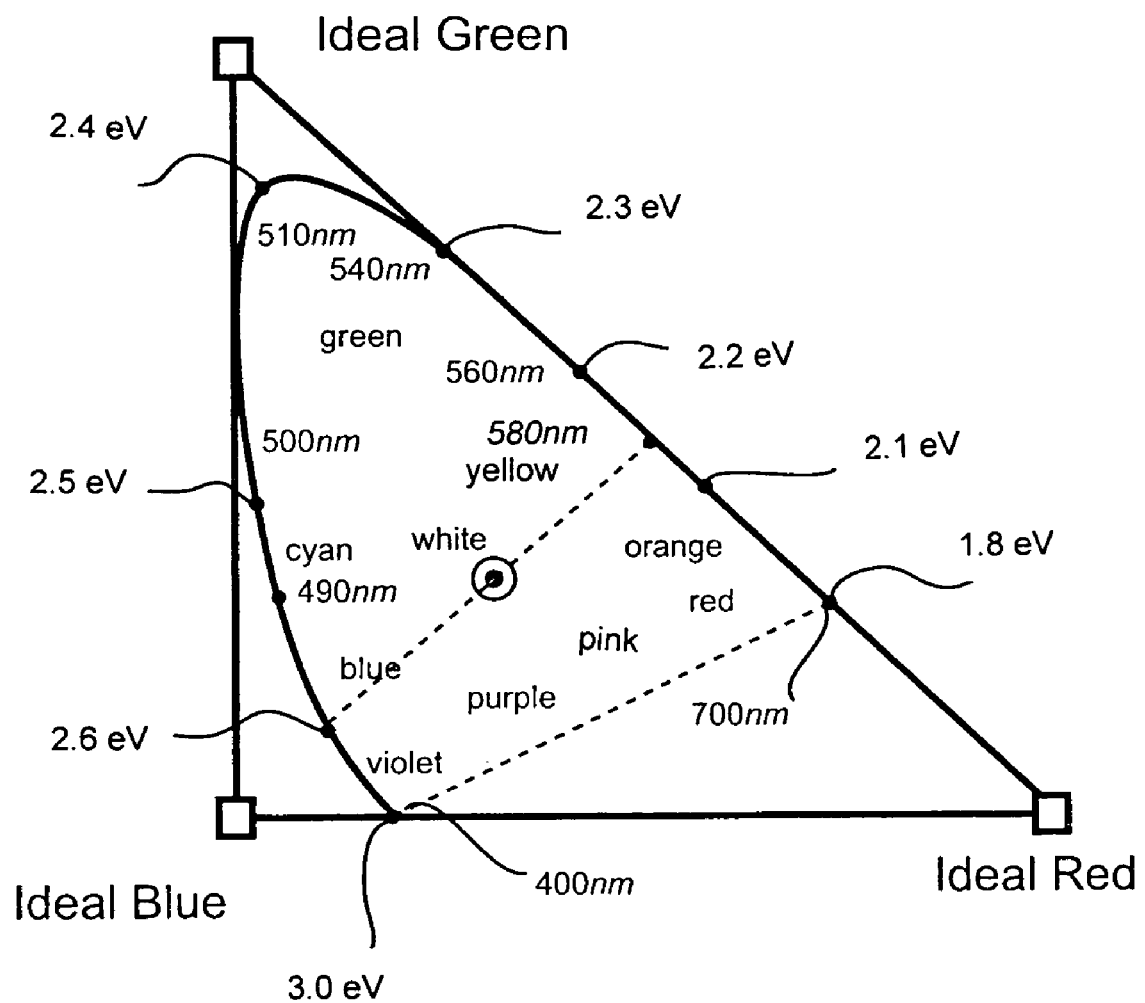
FIG. 7 is a copy of the CIE chromaticity diagram representing all visible colors.

Referring to FIG. 5, a full color display 40 is illustrated including a display area 42 with control electronics 44, including column drivers or controls 46 and row drivers or controls 48, formed adjacent area 42. A broken-out portion 50, including for convenience a single pixel 52, is greatly enlarged in FIG. 6. It will be understood by those skilled in the art that pixel 52 can be actuated by a variety of control circuits including, for example an active matrix in which each pixel 52 includes control transistors (switches) formed therein, and/or column drivers 46 and row drivers 48 can be used to select and actuate each pixel 52 in a regular program or schedule. Further, the emissions of each of the three LEDs of each pixel can be controlled (through the active matrix and/or the column and row drivers) to produce substantially any desired color, generally in accordance with the CIE chromaticity diagram of FIG. 7.

Pixel 52 includes a red (R) light emitting device, a green or blue-green (G) light emitting device, and a blue (B) light emitting device. It is well understood that a pixel with these three color emitting devices can be controlled to produce any color desired, as illustrated in the CIE chromaticity diagram of FIG. 7 (adapted from Nassau, The Physics and Chemistry of Color, (Wiley, New York, 1983)). Further, the trueness or accuracy of the color depends upon the consistence and illumination of each of the three devices. While the chromaticity diagram was constructed by drawing the color triangle with an ideal primary color at each of the three coroners, it is understood that the ideal primary colors are generally not achievable. However, the closer a real primary color can be produced to the ideal primary color, the closer various mixtures of color will be to the chromaticity diagram.

Using the information provided above for rare earth materials and referring back to LED 10 of FIG. 1, LEDs that emit different colored light can be provided. The colored light selection is accomplished by choosing a rare earth with a radiative transition at the wavelength of desired light, for example, Thulium (Tm) with a radiative transition of 0.46 (460 nm). Because the radiative transitions of the various rare earths are closer to the ideal primary colors, the colors produced by the LEDs using the rare earths are much more accurate. Prior art LEDs are formed with materials that are usually mixtures of the primary colors or have a wavelength that is not as close to the primary color as the rare earths.

In the case of a rare earth, such as Erbium (Er), with multiple radiative transitions in the visible light range, the mirror stacks can be tuned to a chosen one so that a selected light is emitted and the other radiative transitions have no effect. For example, if Erbium (Er) material is used in light emitting area 26', the mirror stacks can be tuned to either 540 nm, to emit green light, or to 640 nm, to emit red light. Further, in other embodiments, mirror stack 16 and/or mirror stack 30 may be greatly reduced (a lesser number of pairs) or omitted while still achieving sufficient selectivity for a specific application. It will be understood, however, that LED 10 with at least some mirror stack on the top and bottom is the preferred embodiment to achieve the purest light.

Generally, the colored light selection is accomplished by choosing a rare earth with a single radiative transition at the wavelength of desired light, for example, Thulium (Tm) with a radiative transition of 0.46 (460 nm). Preferably, mirror stack 16 of LED 10 is formed so that each mirror pair in stack 16 has an effective thickness of one half wavelength at the 460 nm radiation. Mirror stack 30 of LED 10, if included, can be formed so that each mirror pair in stack 30 has an effective thickness of one half wavelength at the 460 nm radiation. Thus, LED 10 is effectively tuned to emit light with a 460 nm wavelength. However, because Thulium (Tm) has only one radiative transition of 0.46 (460 nm) tuning the mirrors is not necessary for the selection process but only serves to enhance the light emission.

Generally, the color of the LED is determined by selecting a rare earth with a radiative transition producing a radiation wavelength at the selected color. In cases where the rare earth has more than one radiative transition producing radiation wavelengths of different colors, mirrors or other tuning apparatus can be used to select the desired color. In the full color display in accordance with the present invention, Erbium (Er) material is used in light emitting area 26 or 26' and the mirror stacks are tuned to 540 nm, to emit green light, to fabricate the G LED of FIG. 5. The R LED of FIG. 5 is fabricated by using Erbium (Er) material in light emitting area 26 or 26' and the mirror stacks are tuned to 640 nm, to emit red light. The B LED of FIG. 5 is fabricated by using Thulium (Tm) material in light emitting area 26 or 26' and the mirror stacks are tuned to 460 nm, to emit blue light.

Thus, a new and improved full color display is provided that produces accurate colors in accordance with well known color standards. The full color display utilizes different color emitting devices that produce substantially equal illumination for accurate mixing in accordance with the CIE chromaticity diagram. Further, the new and improved full color display utilizes light emitting devices manufacturable using common well known semiconductor manufacturing techniques and standard semiconductor manufacturing processes.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

The invention claimed is:

1. A full color display comprising a red, a green, and a blue light emitting diode, each light emitting diode including a light emitting region having at least one layer of single crystal rare earth material, the rare earth material in each of the light emitting diodes having at least one radiative transition, and the rare earth material producing a radiation wavelength of approximately 640 nm in the red light emitting diode, 540 nm in the green light emitting diode, and 460 nm in the blue light emitting diode.

2. A full color display as claimed in claim 1 further including a substrate supporting each of the red light emitting diode, the green light emitting diode, and the blue light emitting diode.

3. A full color display as claimed in claim 2 wherein each of the red light emitting diode, the green light emitting diode, and the blue light emitting diode further include a first mirror positioned on the substrate with one side of the light emitting region being positioned on the first mirror.

4. A full color display as claimed in claim 3 wherein the rare earth in the light emitting region of the red light emitting diode includes Erbium (Er), the rare earth in the light emitting region of the green light emitting diode includes Erbium (Er), and the rare earth in the light emitting region of the blue light emitting diode includes Thulium (Tm).

5. A full color display as claimed in claim 4 wherein the first mirror of the red light emitting diode is tuned to approximately 640 nm and the first mirror of the green light emitting diode is tuned to approximately 540 nm.

6. A full color display as claimed in claim 3 wherein the first mirror of each of the red light emitting diode, the green light emitting diode, and the blue light emitting diode includes a mirror stack including a plurality of mirror pairs, and each mirror pair having an effective thickness of at least one half wavelength at the radiation wavelength of the selected color.

7. A full color display as claimed in claim 3 further including a second mirror positioned on the opposite side of the light emitting region for each of the red light emitting diode, the green light emitting diode, and the blue light emitting diode.

8. A full color display as claimed in claim 7 wherein the second mirror stack in each of the red light emitting diode, the green light emitting diode, and the blue light emitting diode includes a plurality of mirror pairs, and each mirror pair has an effective thickness of at least one half wavelength at the radiation wavelength of color emitted.

9. A full color display as claimed in claim 8 wherein the second mirror stack in each of the red light emitting diode, the green light emitting diode, and the blue light emitting diode includes one of pairs of single crystal semiconductor layers and a dielectric DBR.

10. A full color display comprising:
  a plurality of regularly positioned pixels, each pixel including a red, a green, and a blue light emitting diode;

the red, the green, and the blue light emitting diodes, each including a light emitting region with a first cladding layer formed of intrinsic single crystal semiconductor material in electrical communication with a first electrical contact, a light emitting area grown on the first cladding layer and including at least one thin single crystal layer of rare earth material, the rare earth material producing a radiation wavelength of approximately 640 nm in the red light emitting diode, 540 nm in the green light emitting diode, and 460 nm in the blue light emitting diode, and a second cladding layer of intrinsic single crystal semiconductor material grown on the light emitting area; and electrical control circuitry associated with each pixel for controlling an amount of emission of each of the red, the green, and the blue light emitting diodes to produce any desired color.

11. A full color display as claimed in claim 10 wherein the electrical control circuitry includes an active matrix with column drivers and row drivers.

12. A full color display as claimed in claim 10 wherein the intrinsic single crystal semiconductor material in the first cladding layer includes silicon.

13. A full color display as claimed in claim 12 wherein the intrinsic single crystal semiconductor material in the second cladding layer includes silicon.

14. A full color display as claimed in claim 10 wherein each of the red, the green, and the blue light emitting diodes further include a first mirror stack, the first cladding layer is positioned on the first mirror stack, in each of the red, the green, and the blue light emitting diodes the first mirror stack includes a plurality of mirror pairs, and each mirror pair has an effective thickness of at least one half wavelength at the radiation wavelength of the emitted color.

15. A full color display as claimed in claim 14 wherein the first mirror stack in each of the red, the green, and the blue light emitting diodes includes pairs of single crystal semiconductor layers.

16. A full color display as claimed in claim 15 wherein the single crystal semiconductor layers in each of the red, the green, and the blue light emitting diodes are selected from Si, $SiO_2$, and rare earth oxide.

17. A full color display as claimed in claim 10 wherein each of the red, the green, and the blue light emitting diodes further include a second mirror positioned on the second cladding layer.

18. A full color display as claimed in claim 17 wherein the second mirror stack in each of the red, the green, and the blue light emitting diodes includes a plurality of mirror pairs, and each mirror pair has an effective thickness of at least one half wavelength at the radiation wavelength of the emitted color.

19. A full color display as claimed in claim 18 wherein each of the second mirror stacks includes one of pairs of single crystal semiconductor layers and a dielectric DBR.

* * * * *